United States Patent
Finch et al.

(10) Patent No.: US 6,885,002 B1
(45) Date of Patent: Apr. 26, 2005

(54) IRFPA ROIC WITH DUAL TDM RESET INTEGRATORS AND SUB-FRAME AVERAGING FUNCTIONS PER UNIT CELL

(75) Inventors: James A. Finch, Santa Barbara, CA (US); Roger W. Graham, Santa Barbara, CA (US); Stephen H. Black, Buellton, CA (US); Jerry A. Wilson, Goleta, CA (US); Richard H. Wyles, Carpinteria, CA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 09/945,518

(22) Filed: Aug. 31, 2001

(51) Int. Cl.[7] .............................................. H01L 25/00
(52) U.S. Cl. ....................................... 250/332; 250/330
(58) Field of Search ................................ 250/332, 330, 250/338.1, 316.1

(56) References Cited

U.S. PATENT DOCUMENTS

| | | | | |
|---|---|---|---|---|
| 4,065,644 A | * | 12/1977 | Shinosky, Jr. ................ | 379/260 |
| 4,786,831 A | | 11/1988 | Morse et al. ................ | 307/490 |
| 4,857,725 A | | 8/1989 | Goodnough et al. ..... | 250/214 A |
| 4,956,716 A | | 9/1990 | Hewitt et al. ........... | 358/213.27 |
| 4,978,872 A | | 12/1990 | Morse et al. ................ | 307/490 |
| 5,043,820 A | | 8/1991 | Wyles et al. ............ | 358/213.28 |
| 5,113,076 A | | 5/1992 | Schulte .................. | 250/370.06 |
| 5,322,994 A | | 6/1994 | Uno ........................ | 250/208.1 |
| 5,373,182 A | | 12/1994 | Norton ........................ | 257/440 |
| RE34,908 E | | 4/1995 | Wyles et al. ................ | 250/208 |
| 5,523,570 A | | 6/1996 | Hairston | |
| 5,559,336 A | * | 9/1996 | Kosai et al. ............ | 250/370.13 |
| 5,581,084 A | | 12/1996 | Chapman et al. ......... | 250/338.4 |
| 5,602,511 A | | 2/1997 | Woolaway ................... | 330/282 |
| 5,629,522 A | | 5/1997 | Martin | |
| 5,731,621 A | | 3/1998 | Kosai ......................... | 257/440 |
| 5,751,005 A | | 5/1998 | Frye et al. ............. | 250/370.06 |
| 5,959,339 A | * | 9/1999 | Chapman et al. ........... | 257/440 |
| 6,495,830 B1 | * | 12/2002 | Martin .................. | 250/339.02 |
| 6,561,693 B1 | | 5/2003 | Martin | |

* cited by examiner

*Primary Examiner*—David Porta
*Assistant Examiner*—Christine Sung
(74) *Attorney, Agent, or Firm*—William C. Schubert; Karl A. Vick

(57) ABSTRACT

A unit cell (10) of a readout integrated circuit is constructed and operated so as to temporally align an image obtained in a first spectral band with a an image obtained in a second spectral band. A method operates, during a frame period, to sub-frame average a first signal detected in the first spectral band by a multi-spectral detector (12), to sub-frame average a first signal detected in the second spectral band by the multi-spectral detector, and to sub-frame average a second signal detected in the first spectral band by the multi-spectral detector. The method then reads out the sub-frame averaged signals for each spectral band. The sub-frame averaged may be read out simultaneously from the unit cell. When sub-frame averaging the first and second signals in the first spectral band the method performs a plurality of consecutive sub-integrations and stores the result of each sub-integration on a first sub-frame averaging capacitance, and when sub-frame averaging the first signal of the second spectral band the method performs a single integration of the second signal, and stores the result of the integration on a second sub-frame averaging capacitance. The first spectral band may correspond to long wavelength infrared radiation (LWIR), and the second spectral band may correspond to medium wavelength infrared radiation (MWIR).

21 Claims, 2 Drawing Sheets

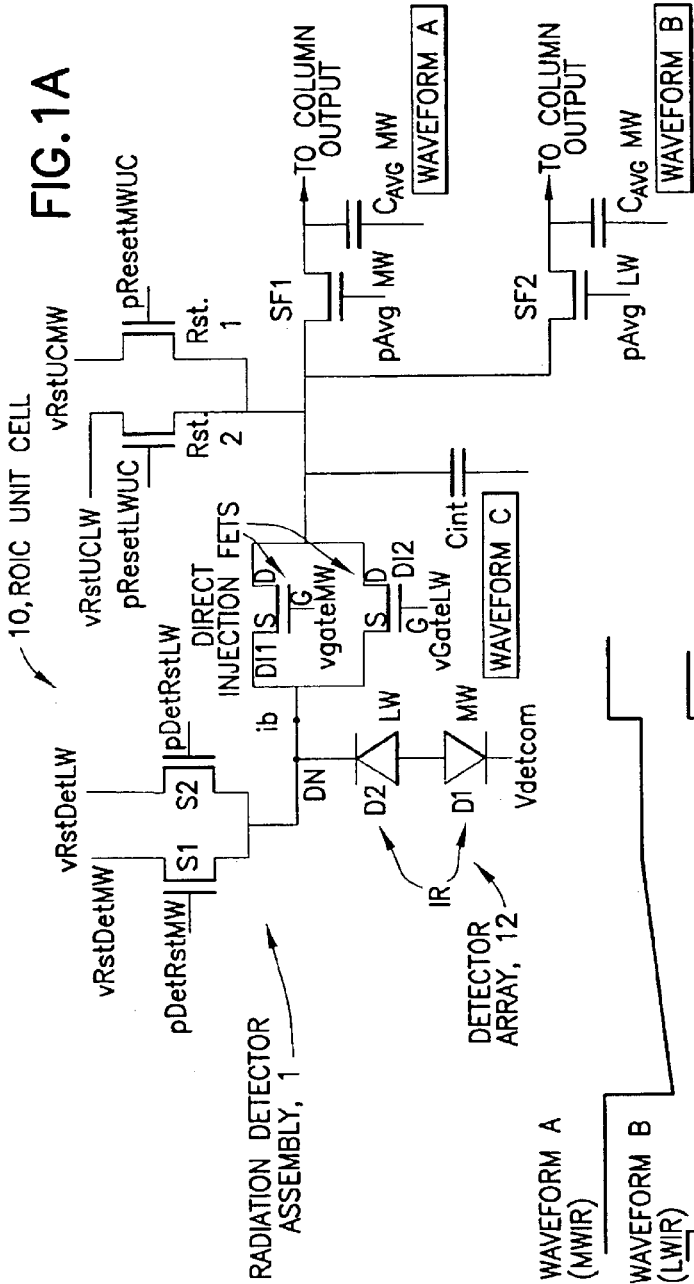
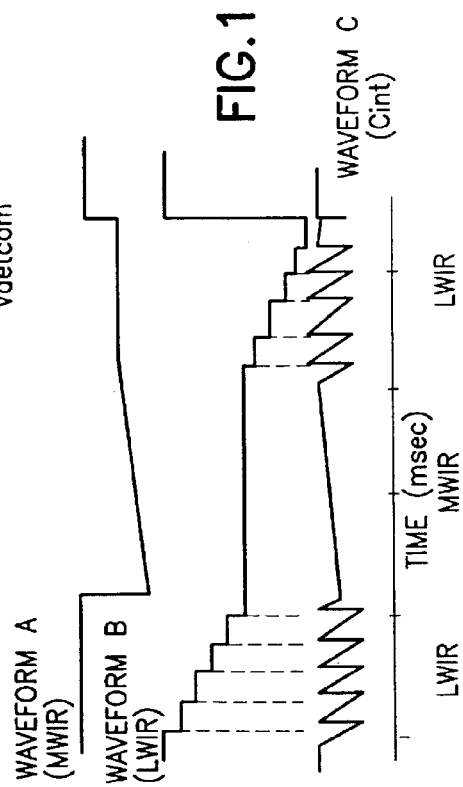

IRFPA ROIC WITH DUAL TDM RESET INTEGRATORS AND SUB-FRAME AVERAGING FUNCTIONS PER UNIT CELL

TECHNICAL FIELD

These teachings relate generally to semi-conductor-based detectors of electromagnetic radiation and, more specifically, to readout integrated circuits (ROICs) used with infrared radiation (IR) focal plane arrays (IRFPAs), in particular those responsive to two or more spectral bands ("colors").

BACKGROUND

IR imaging systems that are responsive to two or more spectral bands presently require separate and additional detectors, electronics, spectral filters, and other optical components for each spectral band. The resulting size, weight, power, and complexity hinders the development and/or production of compact and/or affordable multi-spectral (color) IR imaging systems. Such systems are typically required for use in numerous critical applications, such as missile interceptors, missile launch detection/warning, IR search and track, automatic target recognition, and all climate situational awareness. However, many of these applications require very close registration/alignment between the spectral bands within the composite multi-spectral image (both spatial and temporal), and conventional techniques are typically not well suited for serving such critical and demanding applications.

It is known to attempt to solve these problems with multi-spectral starting (as opposed to scanned) IRFPAs having several design forms. These design forms have in common an array of pixels, typically photodiodes, that detect radiation in two distinct spectral bands. The resulting signals from each band are then read out separately. These designs differ in details, but are generally divided into two categories, each having particular limitations in meeting the system requirements outlined above.

So-called "sequential" designs detect/integrate and read out IR radiation in one band during one frame time (e.g., 16.67 milliseconds), and then detect/integrate and read out the other band during the next frame time. As such, the temporal mis-registration (or delay) between the detection of the two spectral bands is equal to the frame time of the sensor system.

More specifically, previous IRFPA designs have operated the detector in the sequential mode by switching the detector bias on alternate (sequential) frame periods. At least one type of conventional sequential two color ROIC unit cell contains a single capacitor, connected to the detector through a pair of direct-injection (DI) field effect transistors (FETs), such as MOSFETs. As the detector and DI MOSFET biases are switched on alternating frames the sequential ROIC/IRFPA system integrates and reads out one spectral band per frame. This results in the above-mentioned temporal mis-registration or delay between the two bands that is equal to the frame time, typically 16.67 ms. This conventional technique may be analogized to the use of a conventional rotating filter-wheel approach.

In contrast, so-called "simultaneous" designs operate so as to detect/integrate in both spectral bands simultaneously, but they require two separate contacts between the two IR detectors and their corresponding ROIC components for each pixel (i.e., in each ROIC unit cell). In this case the required pixel size and/or cost is increased over that of the sequential two color IRFPA approach, and over that of the conventional single color IRFPA for that matter. The second detector contact per pixel, which requires additional unit cell area, typically prevents an optimum spatial registration (or co-location) between the two sensed spectral bands.

Reference can be had to the following U.S. Patents for teaching various aspects of multi-spectral IR detectors: U.S. Pat. No. 5,113,076, May 12, 1992, "Two Terminal Multi-Band Infrared Radiation Detector", by Eric F. Schulte; U.S. Pat. No. 5,373,182, Dec. 13, 1994, "Integrated IR and Visible Detector", by Paul R. Norton; and U.S. Pat. No. 5,731,621, Mar. 24, 1998, "Three Band and Four Band Multispectral Structures having Two Simultaneous Signal Outputs", by Kenneth Kosai, the disclosures of which are incorporated by reference herein in their entireties.

SUMMARY

The foregoing and other problems are overcome by methods and apparatus in accordance with embodiments of these teachings.

These teachings beneficially combine the simplicity of the sequential detect/integrate and read out structure and method with the improved temporal registration of the simultaneous detect/integrate and read out approach by rapidly switching a sequential two color detector between spectral bands, while providing independent signal routes, one for each detected wavelength band, through the ROIC. The presently preferred unit cell architecture includes (for a two color embodiment) one capacitor that is time-shared so as to integrate the detected signal from one of the two spectral bands at a time, and one additional capacitor per band to store signal charge integrated on the integration capacitor, as well as to provide a means to add or average multiple integrated signals for each band. Switches (e.g., MOSFETs) in the unit cell operate so as to quickly alternate integration back and forth between the two spectral bands/detectors during each frame time, followed by a readout of the signals from both bands, thereby closely approximating true simultaneity. This approach, referred to herein as Time Division Multiplexing or TDM, due to its reduced complexity over conventional simultaneous approaches, significantly improves the producibility of small pixel detectors, since it requires only one electrical contact and one corresponding interconnect (typically an Indium bump) per pixel unit cell.

The ROIC in accordance with these teachings preferably includes and features a single contact between the detector and the ROIC in each unit cell combined with a temporal registration between spectral bands of less than a frame time (e.g., less than about 16 milliseconds, and preferably less than about one millisecond). The ROIC in accordance with these teachings also includes and features a rapid switching of the detector bias and other circuit elements to achieve the TDM integration of signals from multiple detectors within each unit cell. The ROIC in accordance with these teachings may also include and feature at least one reset switch on the detector contact node, thereby promoting rapid and accurate detector bias switching between spectral bands during the time between TDM integration periods, also referred to as sub-frames. The ROIC in accordance with these teachings may additionally include and feature integrate enable switches between the detector contact and each integration capacitor in each unit cell, thereby providing low noise and low crosstalk between the signals originating from the different spectral bands. The use of sub-frame averaging (SFA) may also enhance the quality of the read out signal, and a pair of SFA capacitances may be provided for storing and accumulating detected charge during the frame time.

During use, the improved ROIC is electrically coupled with two color photodiodes (IR detectors), and integrates charge from each detector spectral band onto a single shared integration capacitor in each unit cell. This is accomplished by TDM of the two bands within each integration period (which occurs during some fraction of each frame time). To accomplish this TDM function, the ROIC operates to switch detector and input circuit biases some number of times per integration period. Switching may occur in less than 10 microseconds, and the IRFPA may switch between wavelength bands every 100 microseconds. This achieves an integration efficiency of greater than 90% with a band-to-band temporal registration of about 100 microseconds, which is about two orders of magnitude less than conventional sequential multi-spectral band approaches. The effects of spatial mis-registration on system performance are also addressed and minimized, as the simplified construction of the unit cell enables the unit cell to be placed within a small integrated circuit area (e.g., a 20 micron square unit cell circuit area.)

A method is disclosed for operating a unit cell of a readout integrated circuit, as is a unit cell architecture that operates in accordance with the method. The method includes steps that operate, during a first portion of a frame period, for integrating a first signal detected in a first spectral band, and during a second portion of the frame period, for integrating a first signal detected in a second spectral band. At the end of the frame period, the method reads out the integrated signals for each spectral band. The step of integrating the first signal detected in the first spectral band may further include storing the integrated first signal, the step of integrating the first signal detected in the second spectral band may further include storing the integrated first signal; and the method then also, during a third portion of the frame period, integrates a second signal detected in the first spectral band and combines the integrated second signal with the stored and integrated first signal. The step of reading out then out reads out the combined integrated signals and the stored and integrated first signal in the second spectral band.

These teachings further provide a unit cell of a readout integrated circuit that is coupled during use to a multi-spectral radiation detector (e.g., a two-color photodiode, or a plurality of discrete detectors responsive to different spectral bands). The unit cell includes circuitry operable during a first portion of a frame period (a sub-frame period) for integrating and storing a first signal detected in a first spectral band, the circuitry being operable during a second portion of the frame period for integrating and storing a first signal detected in a second spectral band, and the circuitry being operable during a third portion of the frame period for integrating and storing a second or additional signal detected in the first spectral band, and so forth. The circuitry thereby combines, such as by adding or averaging, the signals stored during the multiple sub-frames of each spectral band within each frame period. Responsive to an end of the frame period, the circuitry reads out the stored signals for each spectral band.

In accordance with the TDM operation that is a feature of these teachings, also provided is a method for operating the unit cell of the readout integrated circuit so as to temporally align an image obtained in the first spectral band with an image obtained in the second spectral band.

A feature of these teachings is a radiation detection assembly having a plurality of multi-spectral radiation detectors and a plurality of readout circuit unit cells. Individual ones of the readout circuit unit cells are electrically coupled to one of the multi-spectral radiation detectors through a node. Each readout circuit unit cell includes circuitry for reading out from the multi-spectral radiation detector, in a time division multiplex (TDM) manner, electrical signals generated by incident multi-spectral radiation.

A further feature of these teachings is a method for operating a radiation detection assembly. The method includes providing a plurality of multi-spectral radiation detectors and a plurality of readout circuit unit cells, where individual ones of the readout circuit unit cells are electrically coupled to one of the multi-spectral radiation detectors through a node; and reading out from the multi-spectral radiation detector, in the TDM manner, electrical signals generated by incident multi-spectral radiation.

In an illustrated, but not limiting, embodiment the first spectral band corresponds to long wavelength infrared radiation (LWIR), and the second spectral band corresponds to medium wavelength infrared radiation (MWIR).

BRIEF DESCRIPTION OF THE DRAWINGS

The above set forth and other features of these teachings are made more apparent in the ensuing Detailed Description of the Preferred Embodiments when read in conjunction with the attached Drawings, wherein:

FIG. 1a is a schematic diagram of an embodiment of a ROIC unit cell circuit constructed in accordance with these teachings;

FIG. 1b is a waveform diagram depicting exemplary waveforms at three circuit nodes;

DETAILED DESCRIPTION OF THE PREFERRED EMBODIMENTS

Figure 2:
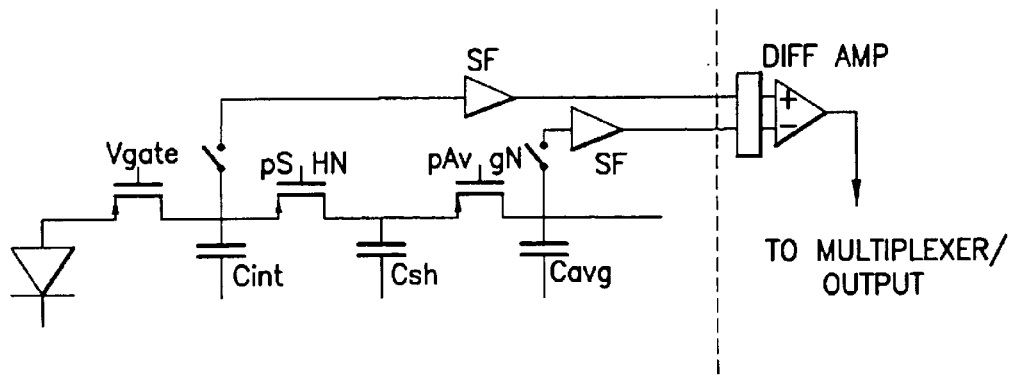
FIG. 2 is a simplified schematic diagram of a ROIC unit cell circuit, in connection with a one color detector, and is useful when discussing Sub-Frame Averaging (SFA)

Reference is made to FIG. 1 for showing an embodiment of a ROIC unit cell circuit 10 constructed in accordance with these teachings. The unit cell circuit 10 is amenable to fabrication in a CMOS process employing, by example, 0.5 micron or 0.35 micron design rules. The unit cell circuit 10 is coupled during use to a detector array 12, constructed as an array of back-to-back photodiodes D1 and D2. In the illustrated example D2 is responsive to Long Wavelength IR (LWIR, e.g., 9.5–10.0 micron cutoff) and D1 is responsive to Medium Wavelength IR (MWIR), that is, to IR in the range of about 3 microns to about 8 microns. However, in other embodiments photodiode pairs that are responsive to other spectral regions could be employed, such as photodiodes responsive to Short Wavelength IR (SWIR) and MWIR, or SWIR and LWIR, or to SWIR (or MWIR or LWIR) and Very Long Wavelength IR (VLWIR). The unit cell circuit 10 is preferably coupled to the photodiode pair of the detector array 12 at a single coupling point, referred to herein as a detector node (DN). This coupling may be made via an electrically conductive contact in combination with a conventional Indium bump, or by using an electrically conductive via. The single coupling point represented by DN is an aspect of these teachings, as it enables the unit cell area to be reduced as compared to conventional designs that require an electrical contact for each photodiode. In practice, the detector array 12 and the ROIC are typically hybridized and bonded together both electrically and mechanically, and are positioned during use at a focal plane (FP) of an IR imaging system. The combination of the detector array 12 and the ROIC containing the readout unit cell circuits 10 may be referred to as a radiation detector assembly 1. The IR radiation sensing embodiment of the radiation detector assembly 1 is typically operated at cryogenic temperatures.

The illustrated embodiment of the unit cell 10 includes two detector reset switches S1 and S2 that are used to quickly re-bias the detector node DN when switching between spectral bands. Also coupled to the detector node DN are two direct injection FETs (DI1 and DI2) that are connected in parallel between DN and a plate of an integration capacitance Cint. A pair of integrator (capacitor) reset FETs (RST1 and RST2) are also provided, one for the LWIR band and one for the MWIR band. In addition to resetting Cint, RST1 and RST2 can be used to minimize blooming, and may also be used to detect and suppress certain countermeasures. The accumulated charge on Cint at the end of an integration period is shared through one of two FET switches (SF1, SF2) onto one of a MWIR or a LWIR sub-frame averaging (SFA) integration capacitance Cavg_MW and Cavg_LW, respectively. The SFA capacitances can also function as additional integration capacitances, if the SFA function is not desired for a particular application. The node containing Cavg_MW is provided to a ROIC MW column output signal conductor, and the node containing Cavg_LW is provided to a separate ROIC LW column output signal conductor, whereby the LWIR and MWIR integrated (and possibly averaged) charge is readout from rows of the unit cell circuit 10 to two separate and independent ROIC column signal paths, and is made available for further signal processing, such as digitizing, conditioning and image processing, at an output of the ROIC. Alternatively, the LWIR and MWIR charges may be read out through a single output signal path, one after the other.

The use of the SFA capacitances Cavg_MW and Cavg_LW is preferred for at least some applications as they allow numerous short sub-frames (i.e., those having a duration of less than the total integration time) to be averaged, and to thus effectively yield a larger electron bucket size, e.g., greater than 20 million electrons (in a 20 micron square unit cell area). Even larger effective bucket capacity can be achieved through the use of smaller IC CMOS design rules.

By utilizing the Sub-Frame Averaging (SFA) technique a number of short sub-frame integrations can be averaged to effectively yield a larger bucket size by allowing a longer total integration time than could be achieved in a single integration period using the total available capacitance per band. Each sub-integration is shared onto a respective one of the storage capacitors Cavg_MW and Cavg_LW. Each successive sharing increases the stored signal such that it approaches that on the integration capacitor Cint at one sub-integration, while at the same time reducing the noise with each averaging. The SFA technique is especially useful for the LWIR detector D2, where there are higher leakage and photo-currents, along with requirements for high sensitivity. The MWIR flux levels and leakage are generally sufficiently small that standard (non-SFA) integration onto the parallel combined capacitance (Cint+Cavg) per band (e.g., 16.5 million electron bucket) does not fill it up. Hence, the SFA is preferably not required for use for the MWIR spectral band. However, SFA can be enabled for MWIR as well to provide a larger effective bucket capacity, should the MWIR operating conditions change (e.g., increased flux or integration times.)

Referring briefly to FIG. 2, note also that SFA has a Noise Improvement Factor (NIF), given by NIF=sqrt((1+α)/(1+α)), where α=Cavg/(Cint+Cavg). As an example, if Cavg is 600 fF and Cint is 200 fF, then the NIF becomes 2.65. If Cavg and Cint are equal, then the NIF becomes 1.7. This NIF is one beneficial characteristic of the larger effect bucket capacity that is an aspect of these teachings.

The unit cell circuit 10 may be operated in a wide range of system operating conditions, for example, conventional 30 Hz, 60 Hz and 120 Hz frame rates with very low to very high flux levels and detector leakage currents. If fast frame rate operation is desired (e.g., the available integration time is limited) in a low flux environment, then a Multi-Frame Averaging (MFA) operation may be desired to compensate for the reduction in incident IR flux during one (shorter) frame time by extending the total integration time over multiple frame times. Conversely, SFA is desired for operation at slower frame rates and/or higher fluxes (i.e., the available integration capacitance is limited.)

In the unit cell circuit 10 of FIG. 1 simultaneous two color temporal alignment is achieved by integrating the LWIR band for, by example, approximately 1 millisecond both before and after a longer 2–5 millisecond integration period of the MWIR band. Thus, the LWIR band TDM yields a nominal two millisecond total integration period that,is divided in time on both sides of the 2–5 mS MWIR integration time. While this provides the desired temporal registration of the LWIR image to the MWIR image, other timings may be employed as well. In the nominal case, the total LWIR acquisition is comprised of a plurality (e.g., 10) short sub-integrations of approximately 0.1 milliseconds each. Five such LWIR sub-integrations are performed on each side of (i.e., both before and after) the longer MWIR integration period, as is generally shown in the waveform diagram of FIG. 1.

Discussing the schematic diagram of FIG. 1 now in further detail, a purpose of the detector node (DN) reset switches S1 and S2 is to quickly re-bias the detector node DN after a change in photodetectors has been selected (i.e., a change from LWIR detector D1 to MWIR detector D2, and vice versa). The reset function implemented by S1 and S2 provides a low impedance path to discharge the capacitance of the selected detector, and also quickly establishes the desired bias point for the next band (e.g. within approximately one microsecond). The use of both S1 and S2 is preferred, as it allows two static bias levels (vRstDetLW and vRstDetMW) to be established and switched in when desired, under the control of switching signals pDetRstLW and pDetRstMW, respectively. The levels of the static bias levels vRstDetLW and vRstDetMW may be fixed, or they may be made programmable. In other embodiments only a single DN bias reset switch may be employed, and the single switch may be provided with a programmable source of bias voltages for use with the LWIR and the MWIR cases. In a further embodiment no DN bias switch may be employed.

In addition to reset switches S1 and S2, which quickly rebias the detector node DN after a change in photodetectors has been selected, the detector common bias (Vdetcom) may also be switched between two different values. This can be done, for example, to increase the dynamic range.

The direct injection (DI) FETs DI1 and DI2 are operated in or near their sub-threshold regions, with their sources (S) connected to the detector node (DN) and their gates (G) coupled to switched biases (for band-switching control). Their respective drains (D) are coupled in common to the node that includes Cint. The DI FET for the LWIR case (DI2) is preferably a MOS device, and thus sources current out of Cint into the detector node DN. The MWIR DI FET DI1 is preferably an NMOS device, and thus sinks current from the detector node DN into Cint.

Turning now to the integration capacitor reset and bloom control/sense FETs RST1 and RST2, these FETs work in tandem with one another during the frame time. For the MWIR case, one FET resets Cint and holds it in reset until the beginning of integration is desired, while the other provides a bloom control spill-way or path for electrons, i.e., bucket levels that exceed some user-defined threshold (e.g., those arising from sun glints, flares, countermeasures, etc.). The LWIR case employs a juxtaposition of function, i.e., what was the bloom control/sense FET now becomes the Cint reset FET and vice-versa. This operation is preferred, as during the MWIR integration period the integration direction on Cint is up, while for the LWIR integration period the integration direction on Cint is down (recall that during MWIR integration current is sourced into Cint, and during LWIR integration current is sourced out of Cint). The FET swapping is thus employed to reset and sense these respective different voltage potentials. The reset potential level for RSTI is vRstUCMW, and the control signal is pRstMWUC, while the reset potential level for RST2 is vRstUCLW, and the control signal is pRstLWUC.

Threat and artifact sensing may be performed with the bloom control/sense FETs. As flux levels exceed a user defined threshold that is set by the off-voltage level of the pResetUC clocks, charge is spilled onto the row bus vRstUCMW or vRstUCLW. This row bus may contain an amplifier to sense this charge and possibly either prevent clocking, i.e. sub-frame averaging, of the latest sub-integration, and/or may notify a host system as the data is read out that a threshold has been exceeded.

A suitable value for Cint is 200 fF. Cint may be physically constructed from two parallel connected 100 fF poly1-poly2 capacitors. In order to minimize the required integrated circuit layout area these two capacitors may be stacked over the averaging capacitors Cavg__MW and Cavg__LW, and their poly1 plates shared. Assuming, by example, a 3.3 volt range when using a 0.35 micron CMOS process, sub-frame averaging with this Cint achieves an effective bucket capacity in excess of 40 million electrons. This large effective bucket capacity is achieved with 10 sub-integrations, each of which is shared onto a 600 fF storage capacitor that is used to implement Cavg__LW.

The SFA switches SF1 and SF2 isolate the averaging capacitors Cavg__MW and Cavg__LW, respectively, from Cint during the sub-integration periods, and alternately allow sharing of charge when required. Cavg__LW and Cavg__MW function as storage capacitors to achieve simultaneous TDM SFA operation.

With the sharing of each sub-integration, the averaging capacitors Cavg__LW and Cavg__MW build up signal slowly, and thus also serve to reduce detector shot noise. This is very advantageous for LWIR operation, which is generally susceptible to higher noise levels and greater leakage currents.

While not shown in FIG. 1, a conventional column capacitive transimpedance amplifier (CTIA) may be used to read both unit cell storage capacitors Cavg__LW and Cavg__MW, through row-enable switch FETs, into an output multiplexer. There may be one CTIA per LW and MW column output, or one CTIA may be multiplexed between the two column outputs.

It is preferred that the area of the unit cell circuit 10 be made small so as to minimize the size of the associated system optics, while maximizing the resolution of the multi-spectral images. The disclosed embodiment is suitable for fabrication within a 20 micron square unit cell area using both 0.35 micron and 0.5 micron rules, and thus provides a very desirable size.

The TDM ROIC discussed above may be modified in various ways, as may occur to those skilled in the art when guided by the foregoing description. For example, and as was mentioned, a single DN reset FET may be employed (or none), as opposed to the two shown in FIG. 1. Also, and referring to FIG. 3, it is within the scope of these teachings to provide two integration capacitances Cint1 and Cint2, one for each spectral band. In this case the SFA capacitances may or may not be required.

Figure 3:
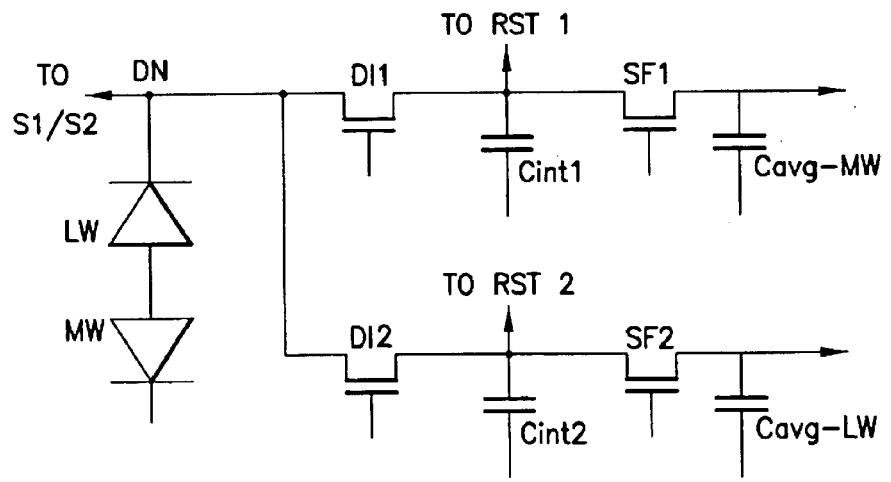
FIG. 3 shows a portion of the multi-spectral unit cell for an embodiment that includes a separate integration capacitance for each spectral band.

It is also noted that the switch pS HN and the capacitor Csh, which are shown in FIG. 2, may be incorporated into the embodiments of FIGS. 1 and 3 as well, as their presence may promote improved noise performance with respect to SFA.

Also, it should be appreciated that the foregoing teachings may be extended to sensing incident IR in more than two spectral bands, as well as to sensing electromagnetic radiation in bands other than the IR band, such as visible electromagnetic radiation. It should also be appreciated that the detected spectral bands need not be disjoint, and that some amount of overlap may occur between the spectral bands.

Thus, while these teachings have been particularly shown and described with respect to preferred embodiments thereof, it will be understood by those skilled in the art that changes in form and details may be made therein without departing from the scope and spirit of these teachings.

What is claimed is:

1. A unit cell of a readout integrated circuit operable during a frame period, comprising:

a detector node for coupling to a radiation detector that is operable in at least two radiation wavelength bands;

a first circuit coupled to said detector node for setting a bias potential at said detector node as a function of a selected radiation band to be detected;

a second circuit coupled between said detector node and an integration capacitance for selectively coupling said integration capacitance to said detector node as a function of the selected radiation band to be detected for sourcing current towards said detector node or for sourcing current from said detector node;

a third circuit coupled to said integration capacitance for periodically resetting said integration capacitance; and a plurality of averaging capacitances switchably coupled to said integration capacitance for storing charge integrated during sub-frame averaging periods of said frame period.

2. A unit cell as in claim 1, wherein said first circuit is comprised of a switch coupled between a source of detector bias and said detector node.

3. A unit cell as in claim 1, wherein said first circuit is comprised of a first switch coupled between a first source of detector bias and said detector node, and a second switch coupled between a second source of detector bias and said detector node.

4. A unit cell as in claim 1, wherein said second circuit is comprised of a first direct injection FET coupled in parallel with a second direct injection FET.

5. A unit cell as in claim 1, wherein said third circuit is comprised of a first switch coupled between a first source of integration capacitance reset potential and said integration capacitance, and a second switch coupled between a second source of integration capacitance reset potential and said integration capacitance.

6. A unit cell as in claim 1, wherein individual ones of said plurality of averaging capacitances are switchably coupled to said integration capacitance through an individual one of a plurality of switches.

7. A unit cell as in claim 1, wherein said circuits are controlled so as to perform a first plurality of sub-frame integrations of a signal present at said detector node corresponding to energy detected in a first spectral band, followed by an integration of a signal present at said detector node corresponding to energy detected in a second spectral band, followed by a second plurality of sub-frame integrations of a signal present at said detector node corresponding to energy detected in said first spectral band.

8. A unit cell as in claim 7, wherein said first spectral band corresponds to long wavelength infrared radiation (LWIR), and wherein said second spectral band corresponds to medium wavelength infrared radiation (MWIR).

9. A unit cell as in claim 1, wherein said third circuit further operates to inhibit an accumulation of excessive charge on said integration capacitance.

10. A method for operating a unit cell of a readout integrated circuit, comprising:
during a first portion of a frame period, integrating a first signal detected in a first spectral band;
during a second portion of the frame period, integrating a first signal detected in a second spectral band; and
at the end of the frame period, reading out the integrated signals for each spectral band.

11. A method as in claim 10, where the step of integrating the first signal detected in the first spectral band further comprises storing the integrated first signal, where the step of integrating the first signal detected in the second spectral band further comprises storing the integrated first signal; and further comprising:
during a third portion of the frame period, integrating a second signal detected in the first spectral band and combining the integrated second signal with the stored and integrated first signal;
and where the step of reading out reads out the combined integrated signals and the stored and integrated first signal in the second spectral band.

12. A unit cell of a readout integrated circuit coupled during use to a multi-spectral radiation detector, comprising first circuitry operable, during a first portion of a frame period, for integrating a first signal detected in a first spectral band; second circuitry operable, during a second portion of the frame period, for integrating a first signal detected in a second spectral band; and third circuitry, responsive to an end of the frame period, for reading out the integrated signals for each spectral band.

13. A unit cell as in claim 12, and further comprising:
circuitry for storing the integrated first signal in the first spectral band and the integrated signal in the second spectral band; where
said first circuitry is operable during a third portion of the frame period for integrating
a second signal detected in the first spectral band and for combining the integrated second signal with the stored and integrated first signal; and where
said third circuitry reads out the combined integrated signals and the stored and integrated first signal in the second spectral band.

14. A method for operating a unit cell of a readout integrated circuit so as to temporally align an image obtained in a first spectral band with a an image obtained in a second spectral band, comprising:
during a first portion of a frame period, performing at least one integration and storing a first signal detected in a first spectral band;
during a second portion of the frame period, performing at least one integration and storing a first signal detected in a second spectral band;
during a third portion of the frame period, performing at least one integration and storing a second signal detected in the first spectral band for combining the signals stored during the first and third portions of the frame period; and
at the end of the frame period, reading out the signals stored for each spectral band.

15. A method as in claim 14, wherein the signals stored for each spectral band are read out simultaneously from the unit cell.

16. A method as in claim 14, wherein the signals stored for each spectral band are read out sequentially from the unit cell.

17. A method as in claim 14, wherein performing at least one integration in the first spectral band performs a plurality of consecutive sub-integrations of the first signal, and stores the result of each sub-integration on a first sub-frame averaging capacitance.

18. A method as in claim 17, wherein performing at least one integration in the second spectral band performs a single integration of the first signal, and stores the result of the integration on a second sub-frame averaging capacitance.

19. A method in claim 14, wherein said first spectral band corresponds to medium wavelength infrared radiation (MWIR), and wherein said second spectral band corresponds to long wavelength infrared radiation (LWIR).

20. A radiation detection assembly, comprising a plurality of multi-spectral radiation detectors and a plurality of readout circuit unit cells, individual ones of said readout circuit unit cells being electrically coupled to one of said multi-spectral radiation detectors through a node and comprising circuitry for reading out from said multi-spectral radiation detector, in a time division multiplex (TDM) manner, electrical signals generated by incident multi-spectral radiation, where said circuitry operates, during a predetermined period, to read out an electrical signal generated in response to incident radiation in a first spectral band, and to then read out an electrical signal generated in response to incident radiation in a second spectral band.

21. A method for operating a radiation detection assembly, comprising:
providing a plurality of multi-spectral radiation detectors and a plurality of readout circuit unit cells, where individual ones of said readout circuit unit cells are electrically coupled to one of said multi-spectral radiation detectors through a node; and
reading out from said multi-spectral radiation detector, in a time division multiplex (TDM) manner, electrical signals generated by incident multi-spectral radiation, where reading out operates, during a predetermined period, to read out an electrical signal generated in response to incident radiation in a first spectral band, and to then read out an electrical signal generated in response to incident radiation in a second spectral band.

* * * * *